US012771306B2

(12) United States Patent
Backman

(10) Patent No.: US 12,771,306 B2
(45) Date of Patent: Oct. 20, 2026

(54) SIGNAL PROCESSING SYSTEM AND ELECTRIC DEVICE

(71) Applicant: AAC Technologies Pte. Ltd., Singapore (SG)

(72) Inventor: Juha Backman, Tampere (FI)

(73) Assignee: AAC Technologies Pte. Ltd., Singapore (SG)

( * ) Notice: Subject to any disclaimer, the term of this patent is extended or adjusted under 35 U.S.C. 154(b) by 123 days.

(21) Appl. No.: 19/023,195

(22) Filed: Jan. 15, 2025

(65) Prior Publication Data

US 2026/0205085 A1 Jul. 16, 2026

(51) Int. Cl.
*H03G 5/16* (2006.01)
*H03G 3/30* (2006.01)

(52) U.S. Cl.
CPC .......... *H03G 5/165* (2013.01); *H03G 3/3036* (2013.01)

(58) Field of Classification Search
CPC ........ H03G 5/165; H03G 3/001; H03G 9/025; H03G 5/025; H03G 7/002; H04R 3/04; H04R 3/007; H03F 2200/03
See application file for complete search history.

(56) References Cited

U.S. PATENT DOCUMENTS

2005/0174189 A1* 8/2005 Jin ........................ H03G 5/165
333/28 R

* cited by examiner

*Primary Examiner* — Kile O Blair
(74) *Attorney, Agent, or Firm* — Wiersch Law Group

(57) ABSTRACT

Provided are a signal processing system and electric device. The signal processing system includes: an input signal module, a displacement model, a filter coefficient generation module, a group delay compensation module, an adjustable equalizer, an amplifier and an audio converter. The input signal module is connected to the group delay compensation module and the displacement model, respectively; the displacement model is connected to the filter coefficient generation module; the group delay compensation module is connected to the adjustable equalizer; the adjustable equalizer is connected to the amplifier, the amplifier is connected to the audio converter, and the filter coefficient generation module is connected to the adjustable equalizer. The driver displacement related frequency response variation is corrected over a wide frequency range and through this reduces distortion, especially intermodulation distortion.

10 Claims, 14 Drawing Sheets

SIGNAL PROCESSING SYSTEM AND ELECTRIC DEVICE

TECHNICAL FIELD

The present disclosure relates to the field of acoustic technology, and in particular to a signal processing system and an electric device.

BACKGROUND

One of the major mechanisms for intermodulation distortion in the midrange and at high frequencies (that is, well above the driver fundamental resonance) is frequency response variation with loudspeaker diaphragm movement.

Technical solutions in the related art can address the nonlinearity of the transducer itself, not the variation of system parameters causing frequency response at mid and high frequencies. Algorithms that address the mid/high frequency modulation distortion by limiting low-frequency content unavoidably cause coloration of sound, easily leading to sound distortion.

SUMMARY

In view of this, embodiments of the present disclosure provide a signal processing system and an electric device for correcting the driver displacement related frequency response variation over a wide frequency range and through this reduces distortion, especially intermodulation distortion.

In an aspect, an embodiment of the present disclosure provides a signal processing system, applied to an electric device and including: an input signal module, a displacement model, a filter coefficient generation module, a group delay compensation module, an adjustable equalizer, an amplifier and an audio converter. The input signal module is connected to the group delay compensation module and the displacement model, respectively; the displacement model is connected to the filter coefficient generation module; the group delay compensation module is connected to the adjustable equalizer; the adjustable equalizer is connected to the amplifier, the amplifier is connected to the audio converter, and the filter coefficient generation module is connected to the adjustable equalizer.

In an improved embodiment, the signal processing system further includes: a low-pass filter, the displacement model is connected to the low-pass filter, and the low-pass filter is connected to the filter coefficient generation module.

In an improved embodiment, the low-pass filter includes a first low-pass filter, and the signal processing system further includes a port velocity model and a second low-pass filter; and the input signal module is connected to the port velocity model, the port velocity model is connected to the second low-pass filter, and the second low-pass filter is connected to the filter coefficient generation module.

In an improved embodiment, the low-pass filter includes a first low-pass filter, and the system further includes a third low-pass filter, a high-pass filter and an adder; and the group delay compensation module is connected to the third low-pass filter, the third low-pass filter is connected to the adder, the group delay compensation module is connected to the high-pass filter, the high-pass filter is connected to the adjustable equalizer, and the adjustable equalizer is connected to the adder, and the adder is connected to the amplifier.

In an improved embodiment, the low-pass filter includes a first low-pass filter, the adjustable equalizer includes an adjustable high-frequency equalizer, and the system further includes: a third low-pass filter, an adjustable low-frequency equalizer, a high-pass filter and an adder; and the group delay compensation module is connected to the third low-pass filter, the third low-pass filter is connected to the adjustable low-frequency equalizer, the adjustable low-frequency equalizer is connected to the adder, the group delay compensation module is connected to the high-pass filter, the high-pass filter is connected to the adjustable high-frequency equalizer, the adjustable high-frequency equalizer is connected to the adder, the adder is connected to the amplifier, and the filter coefficient generation module is respectively connected to the adjustable low-frequency equalizer and the adjustable high-frequency equalizer.

In an improved embodiment, the filter coefficient generation module is configured to obtain a filter coefficient through an interpolation lookup table, an interpolation function or machine learning.

In an improved embodiment, the group delay compensation module is configured to compensate for group delay of the displacement model and the low-pass filter.

In an improved embodiment, the audio converter includes a speaker, an earphone, or an electroacoustic/electromechanical transducer.

In an improved embodiment, the displacement model includes a computationally implemented model for diaphragm displacement of a loudspeaker.

In another aspect, an embodiment of the present disclosure provides an electric device, including a signal processing system applied to an electric device and including: an input signal module, a displacement model, a filter coefficient generation module, a group delay compensation module, an adjustable equalizer, an amplifier and an audio converter. The input signal module is connected to the group delay compensation module and the displacement model, respectively; the displacement model is connected to the filter coefficient generation module; the group delay compensation module is connected to the adjustable equalizer; the adjustable equalizer is connected to the amplifier, the amplifier is connected to the audio converter, and the filter coefficient generation module is connected to the adjustable equalizer.

BRIEF DESCRIPTION OF DRAWINGS

In order to better illustrate technical solutions in embodiments of the present disclosure, the accompanying drawings used in the embodiments are briefly introduced as follows. It should be noted that the drawings described as follows are merely part of the embodiments of the present disclosure, and other drawings can also be acquired by those skilled in the art without paying creative efforts.

DESCRIPTION OF EMBODIMENTS

Figure 1:
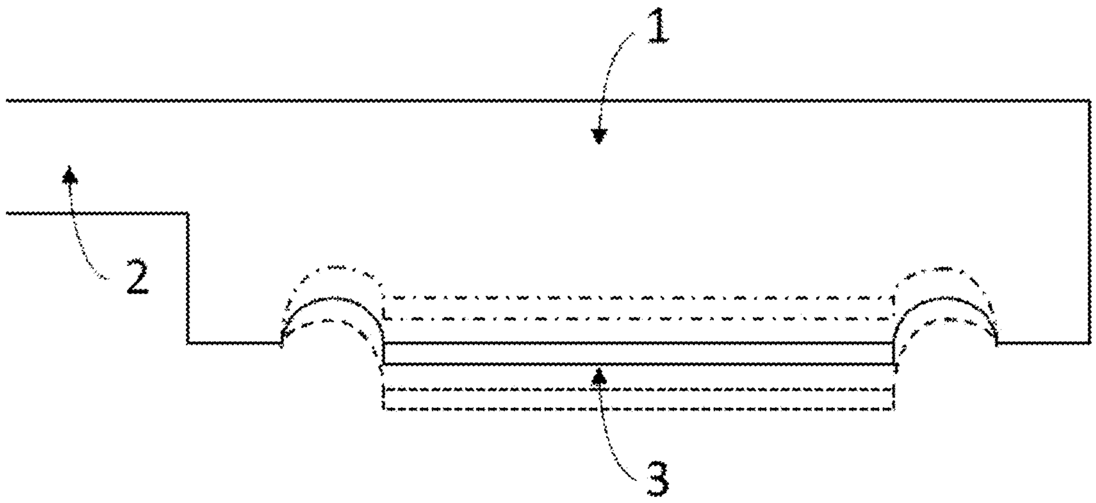
FIG. 1 is a schematic diagram illustrating a structure of a loudspeaker of a resonator according to an embodiment of the present disclosure.

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions “a”, “an”, “the” and “said” used in the embodiments and appended claims of the present disclosure are also intended to represent plural form expressions thereof.

It should be understood that the term “and/or” used herein is merely an association relationship describing associated objects, indicating that there may be three relationships, for example, A and/or B may indicate that three cases, i.e., A existing individually, A and B existing simultaneously, B existing individually. In addition, the character “/” herein generally indicates that the related objects before and after the character form an “or” relationship.

As the modulation distortion mechanisms related to frequency variation in an information processing system are not so far being discussed in the scientific literature, there appear to be no related arts that would describe a method that is oriented towards distortion caused by frequency response variation at mid and high frequencies. The technical solutions in the related art are related to reducing the distortion caused by the transducer nonlinearity, and this distortion can affect the system performance, especially near the fundamental resonance of the driver. Some technical solutions on nonlinear acoustic echo cancellation contain similar features than the transducer nonlinearity compensation methods, and an overview of the most common solutions is presented.

One of the major mechanisms for intermodulation distortion in the midrange and at high frequencies (that is, well above the driver fundamental resonance) is frequency response variation with loudspeaker diaphragm movement. In typical microspeaker applications where the loudspeaker radiates to the external air through a resonating cavity the response variation is caused to a large extent by the variation of the geometry and the related acoustics of the loudspeaker front cavity, with some contribution from the variability of the overall sensitivity due to the position dependence of the magnetic flux seen by the voice coil.

The transducer nonlinearity is caused by one or more of the following factors: nonlinear force factor (Bl), both as a function of displacement (major factor) and drive current (minor factor), nonlinear compliance, and nonlinear mechanical damping. The voice coil resistance is another cause of nonlinearity, and taking it into account is necessary for successful nonlinearity prediction and compensation, but it is not dependent on the momentary value of displacement like the other nonlinearity factors, but on heating and cooling history of the voice coil and thus requires a dedicated model and compensation method, while other nonlinearity mechanisms can be compensated with memoryless methods. The estimation of voice coil resistance is well known from loudspeaker protection algorithms. One approach to nonlinearity compensation is to use mirror filters, these mirror filters are implemented as polynomial nonlinearity function that is an inverse of the observed transducer nonlinearity, using appropriate pre- and de-emphasis filters around the nonlinear element. The use of nonparametric (i.e. with model parameters not directly described in terms of physical variables) is widely used in nonlinear system identification.

Technical solutions in the related art address the nonlinearity of the transducer itself, focusing mostly on low-frequency performance, not the variation of system parameters causing frequency response at mid and high frequencies. Acoustical solutions for the problem exist, but their scope is limited to a limited range of applications and they cannot compensate systems where both transducer nonlinearity and parametric variation of acoustics affect the mid/high frequency performance. Algorithms that address the mid/high frequency modulation distortion by limiting low-frequency content unavoidably cause coloration of sound.

FIG. 1 is a schematic diagram illustrating a structure of a loudspeaker of a resonator according to an embodiment of the present disclosure. As shown in FIG. 1, the loudspeaker includes a front cavity 1 and an output port 2. A diaphragm 3 may be shown at a nominal position (solid line), and displaced up (dash-dot line) and down (dashed line). The major effect causing frequency response shape variation is the variation of an internal volume of the front cavity 1, causing changes in the resonance cavity formed by the front cavity 1 and the output port 2.

Figure 2:
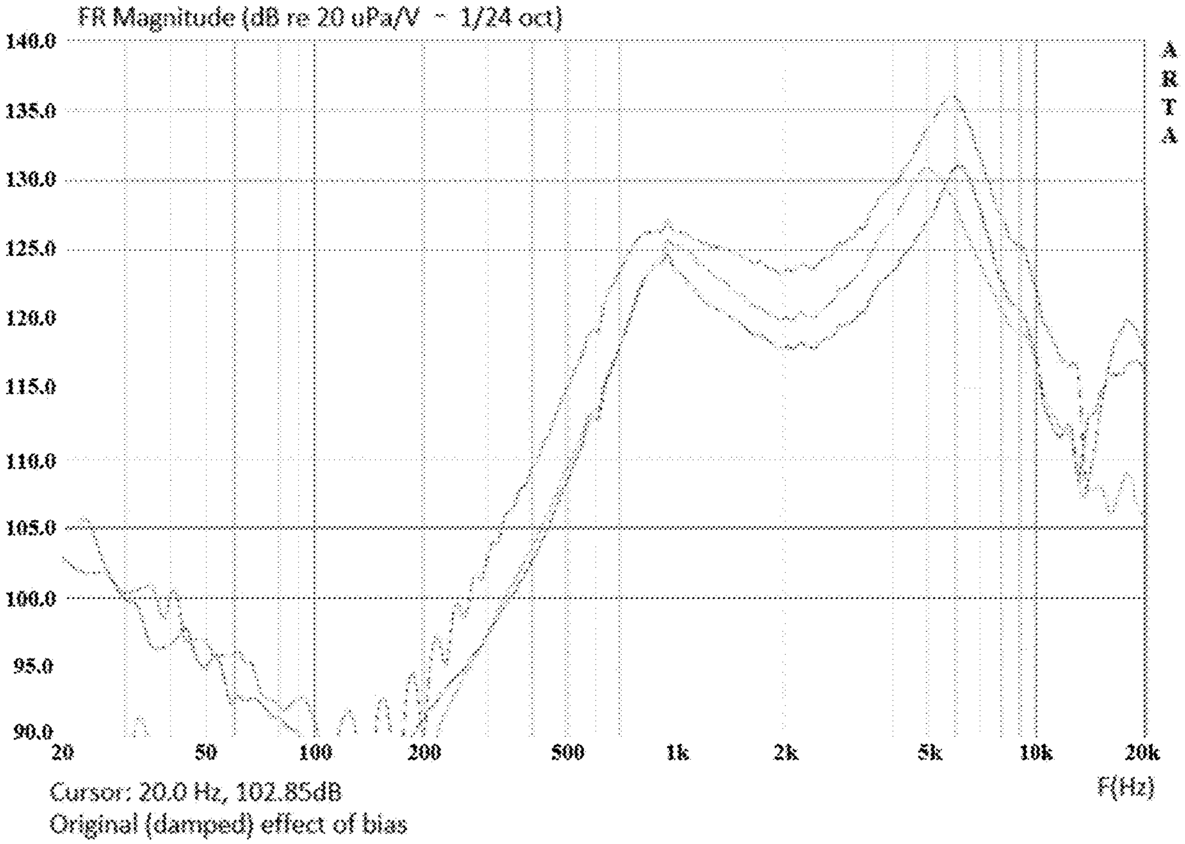
FIG. 2 is a schematic diagram illustrating a measured displacement dependent frequency response in a micro-speaker with a resonance front cavity according to an embodiment of the present disclosure.

FIG. 2 is a schematic diagram of a measured displacement dependent frequency response in a microspeaker with a resonance front cavity according to an embodiment of the present disclosure. As shown in FIG. 2, the vertical axis represents an FR magnitude, and the horizontal axis represents cursor: 20.0 Hz, 102.85 dB, and original (damped) effect of bias.

Figure 3:
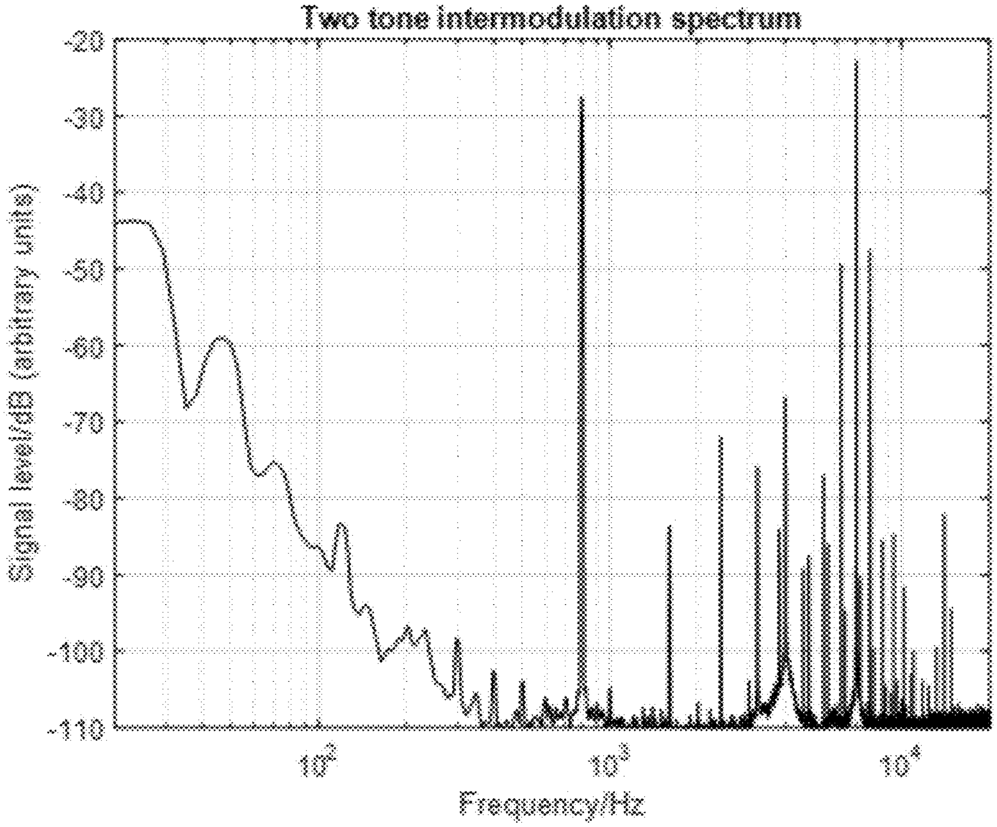
FIG. 3 is a schematic diagram illustrating two-tone intermodulation spectrum according to an embodiment of the present disclosure.
Figure 4:
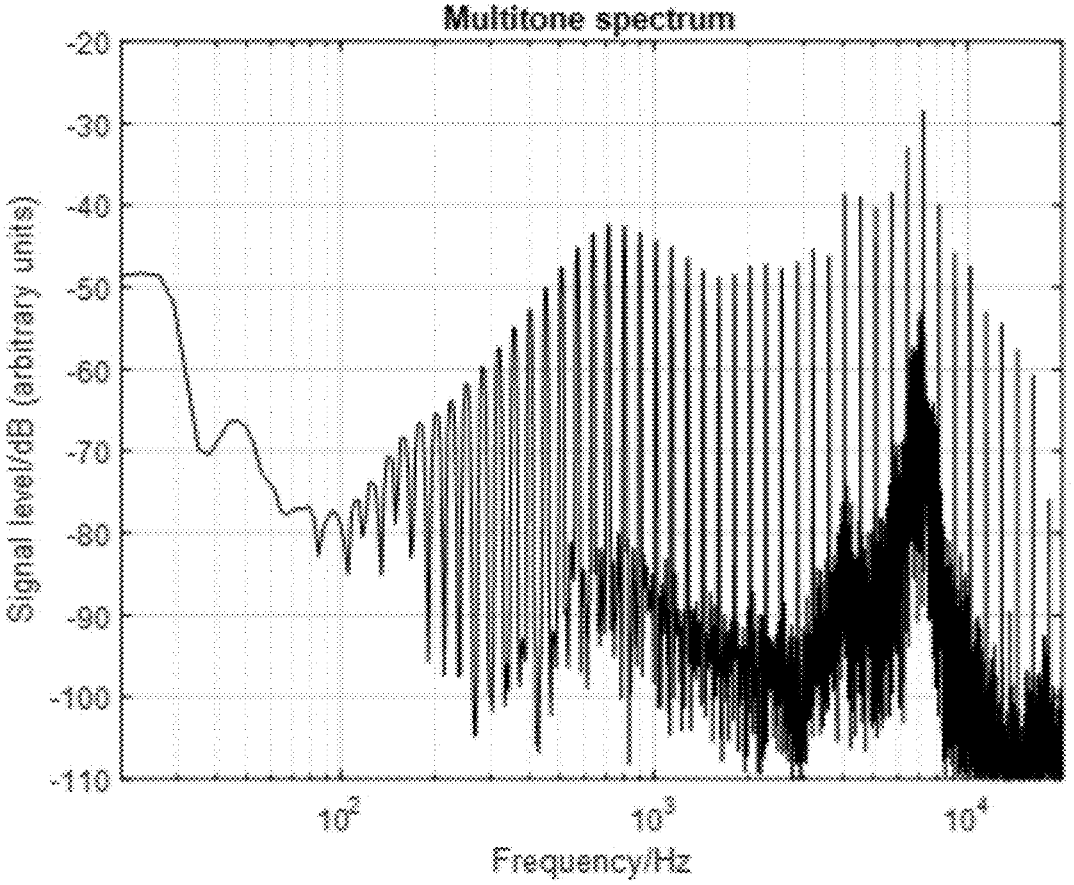
FIG. 4 is a schematic diagram illustrating multitone spectrum according to an embodiment of the present disclosure.

The measurement results show that strong intermodulation distortion exists near the resonance frequency of the front cavity 1. FIG. 3 is a schematic diagram illustrating two-tone intermodulation spectrum according to an embodiment of the present disclosure. In FIG. 3, the vertical axis represents a signal level in dB, and the horizontal axis represents frequency in Hz; two-tone intermodulation distortion of a loudspeaker with response variation may be as shown as FIG. 2. FIG. 4 is a schematic diagram illustrating multitone spectrum according to an embodiment of the present disclosure. In FIG. 4, the vertical axis represents a signal level in dB, and the horizontal axis represents frequency in Hz, multitone intermodulation distortion of a loudspeaker with response variation may be as shown as FIG. 2. There are other mechanisms that can cause response variation, especially in larger (i.e. not microspeaker) loudspeakers, which can be addressed through a signal processing system working in a manner similar to the one described in the embodiments of the present disclosure. One of the significant mechanisms in larger systems is the variation of voice coil inductance with diaphragm movement, which is generally recognized to be one of the major sources of midrange and treble intermodulation distortion over a wide frequency range, and the variation of the cavity resonance caused by the air space behind the diaphragm and the holes in the loudspeaker chassis, affecting typically a narrow frequency range. There are also other mechanisms that can cause displacement dependent response variation, so the scope of the embodiments of the present disclosure is not limited to compensating only front cavity related distortion.

In order to solve the technical problems in the related art, the embodiments of the present disclosure provides a signal processing system that corrects the driver displacement related frequency response variation over a wide frequency range and through this reduces distortion, especially intermodulation distortion.

Figure 5:
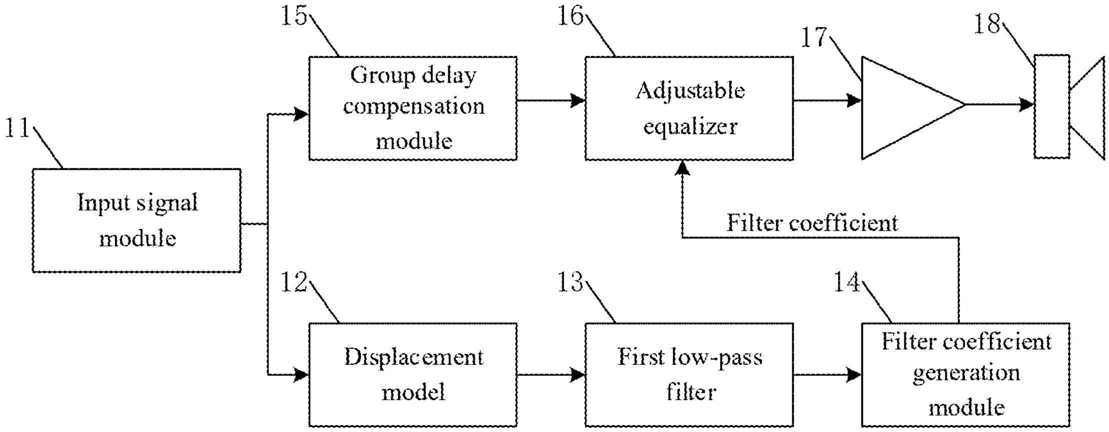
FIG. 5 is a schematic diagram illustrating a structure of a signal processing system according to an embodiment of the present disclosure.

FIG. 5 is a schematic diagram illustrating a structure of a signal processing system according to an embodiment of the present disclosure. As shown in FIG. 5, the system includes: an input signal module 11, a displacement model 12, a first low-pass filter 13, a filter coefficient generation module 14, a group delay compensation module 15, an adjustable equalizer 16, an amplifier 17 and an audio converter 18.

The input signal module 11 is connected to the group delay compensation module 15 and the displacement model 12, respectively. The displacement model 12 is connected to the first low-pass filter 13. The first low-pass filter 13 is connected to the filter coefficient generation module 14. The group delay compensation module 15 is connected to the adjustable equalizer 16. The adjustable equalizer 16 is connected to the amplifier 17. The amplifier 17 is connected to the audio converter 18. The filter coefficient generation module 14 is connected to the adjustable equalizer 16.

In the embodiments of the present disclosure, the filter coefficient generation module 14 is configured to obtain a filter coefficient through an interpolation lookup table, an interpolation function or machine learning.

In the embodiments of the present disclosure, the group delay compensation module 15 is configured to compensate for group delay of the displacement model 12 and the first low-pass filter 13.

In the embodiments of the present disclosure, the audio converter 18 includes a speaker, an earphone, an electroacoustic/electromechanical transducer, where the frequency response of the signal processing system can exhibit variation of frequency response related to the temporary values of system state parameters such as transducer displacement, velocity in a part of acoustic system, or internal temperature In the embodiments of the present disclosure, the displacement model 12 includes a computationally implemented model for the diaphragm displacement of the loudspeaker.

In the embodiments of the present disclosure, the amplifier 17 may be implemented as a basically linear filter, with filter coefficients updated for each sample or for short frames using the displacement information.

In the embodiments of the present disclosure, the purpose of the filter is to equalize the difference between the target frequency response at the rest position of the diaphragm and the actual frequency response measured or computed at a statically displaced diaphragm position.

Figure 6:
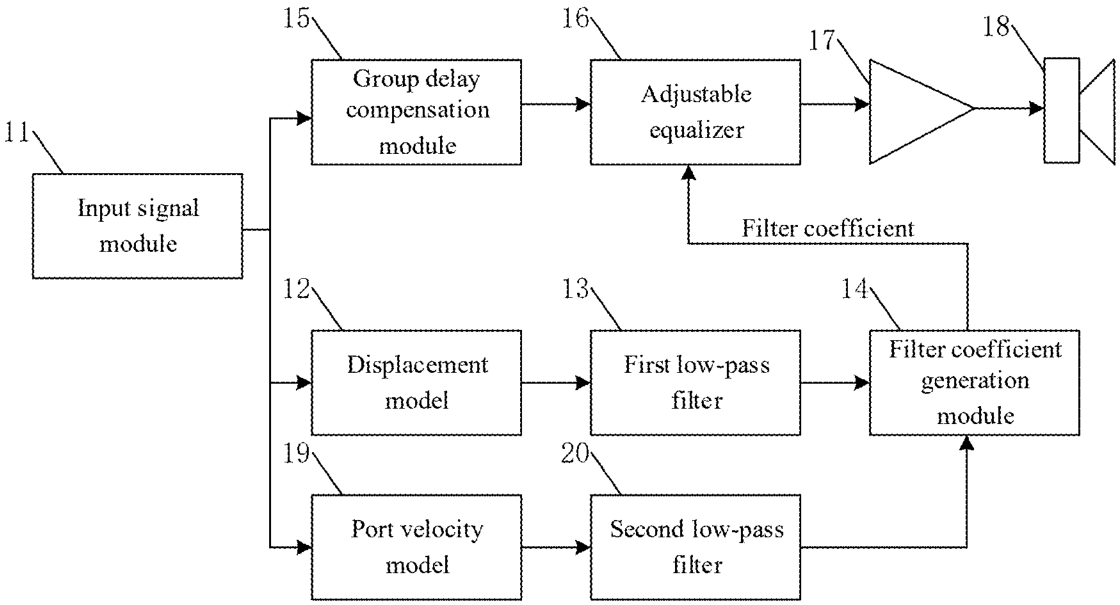
FIG. 6 is a schematic diagram illustrating a structure of a signal processing system according to another embodiment of the present disclosure.

In the embodiments of the present disclosure, in some cases, the flow velocity caused by the low-frequency signal in the port can have a significant effect on the losses in the port, in which case the filter parameter adjustment can benefit from having also the port velocity as a control parameter. FIG. 6 is a schematic diagram illustrating a structure of a signal processing system according to another embodiment of the present disclosure. As shown in FIG. 6, the system includes: an input signal module 11, a displacement model 12, a first low-pass filter 13, a filter coefficient generation module 14, a group delay compensation module 15, an adjustable equalizer 16, an amplifier 17 and an audio converter 18.

The input signal module 11 is connected to the group delay compensation module 15 and the displacement model 12, respectively. The displacement model 12 is connected to the first low-pass filter 13. The first low-pass filter 13 is connected to the filter coefficient generation module 14. The group delay compensation module 15 is connected to the adjustable equalizer 16. The adjustable equalizer 16 is connected to the amplifier 17. The amplifier 17 is connected to the audio converter 18. The filter coefficient generation module 14 is connected to the adjustable equalizer 16.

The system further includes a port velocity model 19 and a second low-pass filter 20. The input signal module 11 is connected to the port velocity model 19. The port velocity model 19 is connected to the second low-pass filter 20. The second low-pass filter 20 is connected to the filter coefficient generation module 14.

In the embodiments of the present disclosure, when correcting transducer related low frequency distortion (in this case "low frequency" means near the fundamental resonance of the transducer), the part of the signal that causes the place dependent is also the signal that needs to be compensated, and thus the compensation processing needs to be both time dependent and non-linear. On the other hand, in the embodiments of the present disclosure, the cause of the nonlinearity is the low-frequency signal, and the signal to be compensated is at higher frequencies than the signal component causing the nonlinearity, and the signal to be compensated behaves in a linear manner with respect to its own signal amplitude, but passes through a time variant system. Thus, the compensation filter needs to be time dependent, but can be linear with respect to the signal amplitude. This greatly simplifies the correction filter design. The accuracy of the compensation can be in all systems improved by using feedback information for adaptively updating the nonlinear driver model. This feedback signal can come from a loudspeaker current measurement, a loudspeaker current and voltage measurement, or as information from a separate feedback sensor.

Figure 7:
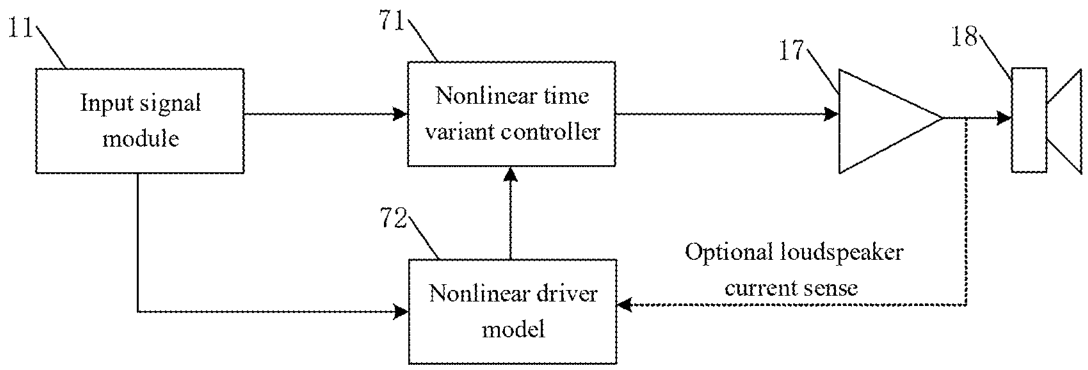
FIG. 7 is a schematic diagram illustrating a structure of a signal processing system according to another embodiment of the present disclosure.

FIG. 7 is a schematic diagram illustrating a structure of a signal processing system according to another embodiment of the present disclosure. As shown in FIG. 7, the system includes: an input signal module 11, a nonlinear time variant controller 71, a nonlinear driver model 72, an amplifier 17 and an audio converter 18.

The input signal module 11 is connected to the nonlinear time variant controller 71 and the nonlinear driver model 72, respectively. The nonlinear time variant controller 71 is connected to the amplifier 17. The amplifier 17 is connected to the audio converter 18. The nonlinear driver model 72 is connected to the nonlinear time variant controller 71. FIG. 7 may be a generic structure of a traditional nonlinear signal processing system, used typically for driver low-frequency nonlinearity compensation.

Figure 8:
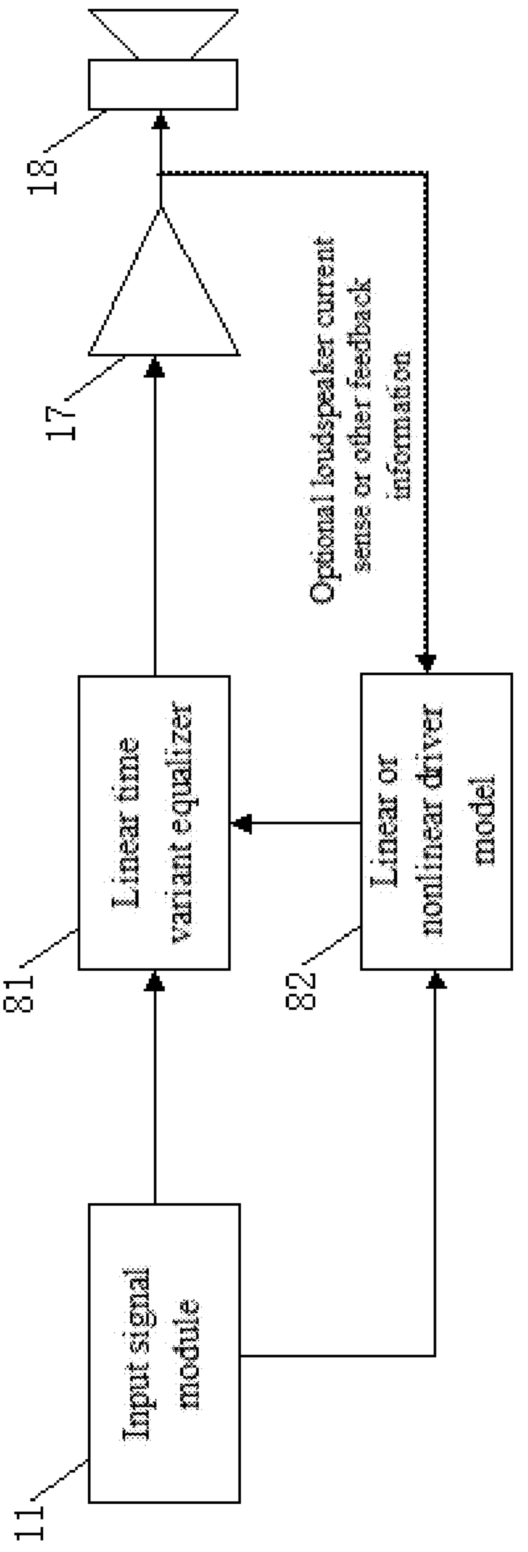
FIG. 8 is a schematic diagram illustrating a structure of a signal processing system according to another embodiment of the present disclosure.

FIG. 8 is a schematic diagram illustrating a structure of a signal processing system according to another embodiment of the present disclosure. As shown in FIG. 8, the system includes: an input signal module 11, a linear time variant equalizer 81, a linear or nonlinear driver model 82, an amplifier 17 and an audio converter 18.

The input signal module 11 is connected to the linear time variant equalizer 81 and the linear or nonlinear driver model 82, respectively. The linear time variant equalizer 81 is connected to the amplifier 17. The amplifier 17 is connected to the audio converter 18. The linear time variant equalizer 81 is connected to the linear or nonlinear driver model 82. FIG. 8 may be a generic structure of traditional nonlinear signal processing system, usable also for mid/high frequency response variation compensation.

The traditional low-frequency nonlinearity compensation and voice coil temperature compensation algorithms can be used together with the embodiments of the present disclosure, which may improve the performance of the embodiments of the present disclosure as the diaphragm displacement becomes better predictable. It is also possible to use the same driver displacement model for multiple signal processing systems.

Figure 9:
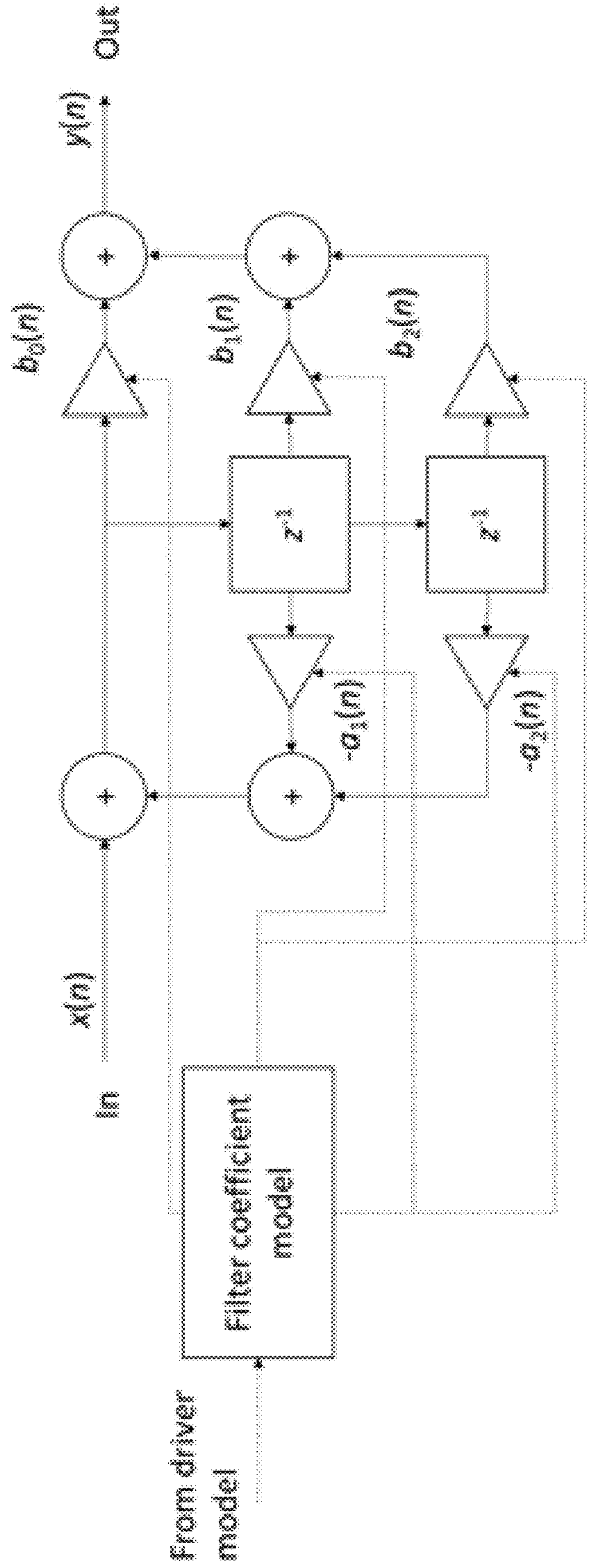
FIG. 9 is a schematic diagram illustrating a structure of a time variant second order IIR equalizer block according to another embodiment of the present disclosure.

The time variant equalizer is typically implemented as an infinite impulse response (IIR) filter, which can consist of multiple filter blocks. One example of implementation of one second-order filter block is given in FIG. 9. FIG. 9 is an example embodiment of an adjustable equalizer 16 in FIG. 5 or FIG. 6, implemented as a "direct form" filter block. The equalizer can consist of one or more of these filter blocks, or can consist of one or more of simpler (first-order) filter blocks. FIG. 9 is a schematic diagram illustrating a structure of a time variant second order IIR equalizer block according to another embodiment of the present disclosure. A filter coefficient model in FIG. 9 can be a lookup table, interpolation function, etc., and the filter coefficients a and b can be updated for each sample.

Figure 10:
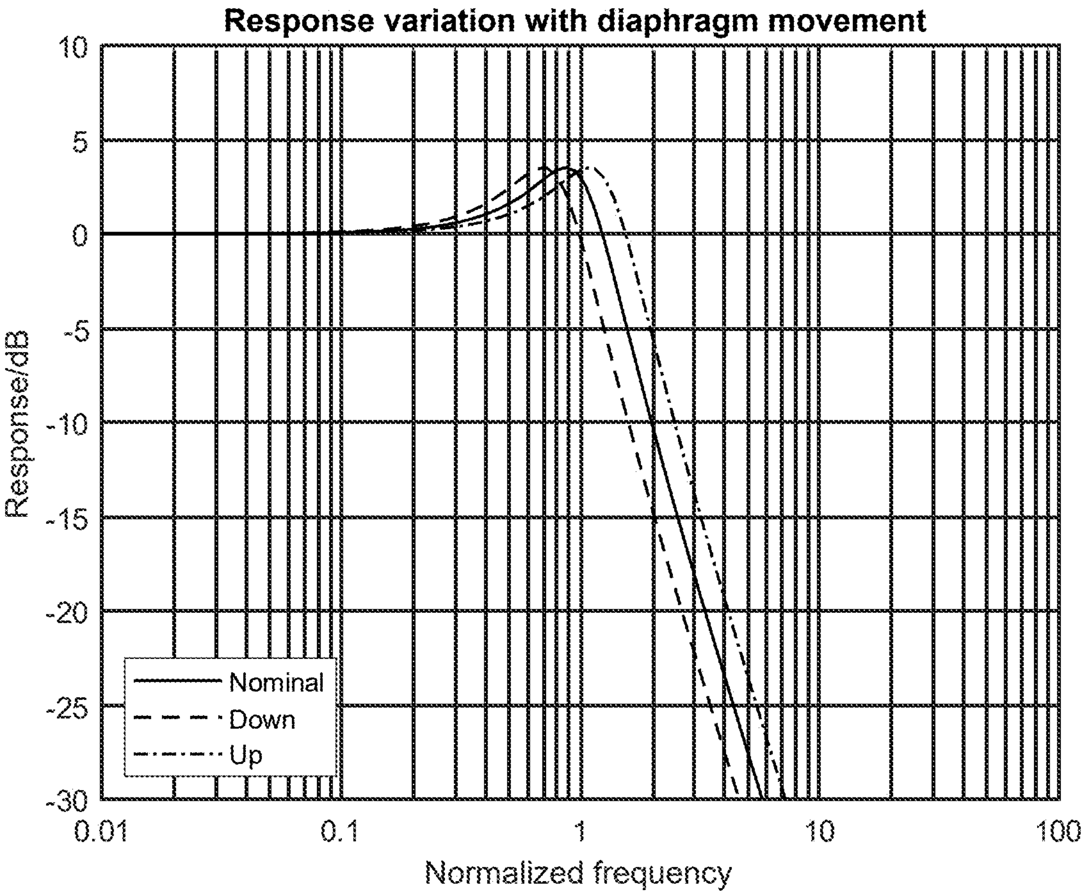
FIG. 10 is a schematic diagram illustrating response variation with diaphragm movement according to another embodiment of the present disclosure.

FIG. 10 is a schematic diagram illustrating response variation with diaphragm movement according to another embodiment of the present disclosure, with simplified frequency response of a loudspeaker front cavity in FIG. 1 when driver displacement effects are taken into account. The frequency scale is normalized to the nominal resonance frequency of the loudspeaker front cavity. As shown in FIG. 10, the horizontal axis represents the normalized frequency, and the vertical axis represents the response. FIG. 10 shows schematic diagrams of response variation with diaphragm movement in terms of nominal, up, and down. FIG. 10 represents a simplified frequency response behavior of the system in FIG. 1, when only the effect of the movement in the main high frequency cavity resonance is taken into account.

Figure 11:
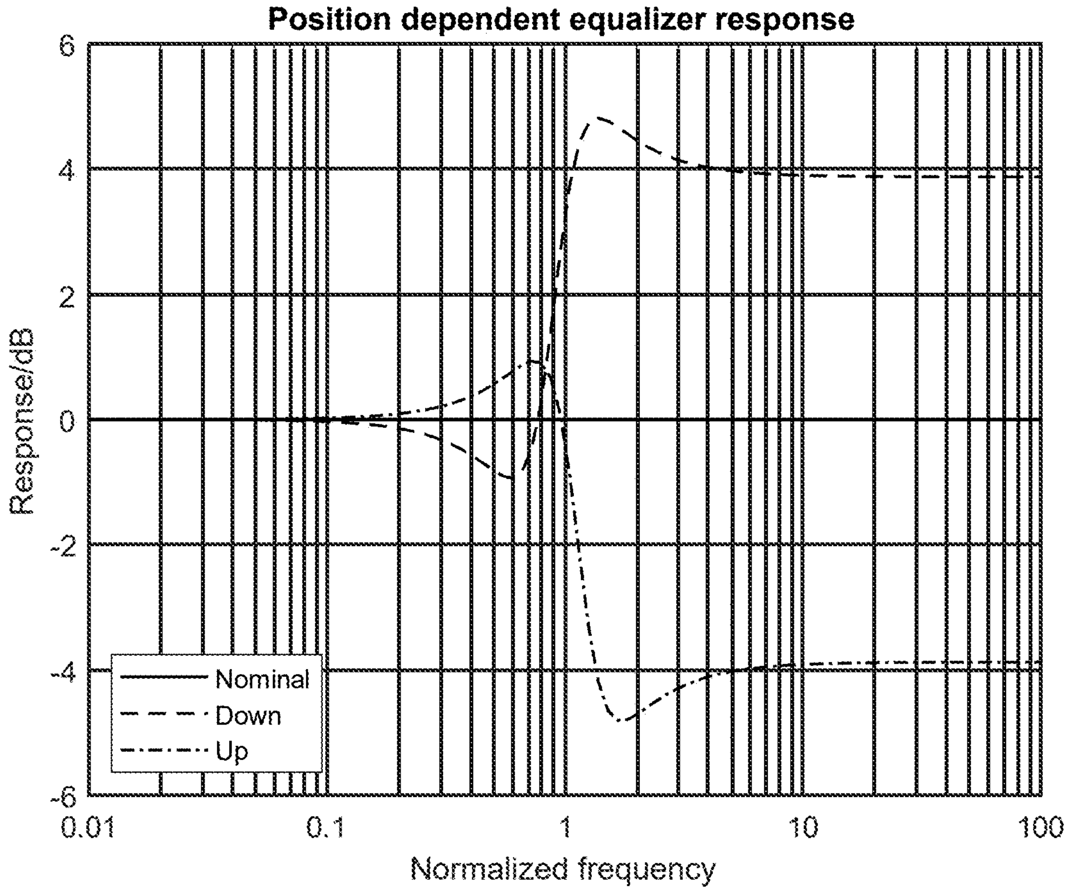
FIG. 11 is a schematic diagram illustrating equalizing a position dependent equalizer response in FIG. 10 to a nominal target according to an embodiment of the present disclosure.

FIG. 11 is a schematic diagram illustrating equalizing a position dependent equalizer response in FIG. 10 to a nominal target according to an embodiment of the present disclosure. As shown in FIG. 11, the horizontal axis represents the normalized frequency, and the vertical axis represents the response. FIG. 11 represents the diaphragm position dependent equalizer responses that are needed to correct the "up" and "down" responses in FIG. 10 to be the same as the "nominal" response. This equalization can be implemented using e.g. the filter architecture of FIG. 9.

Figure 12:
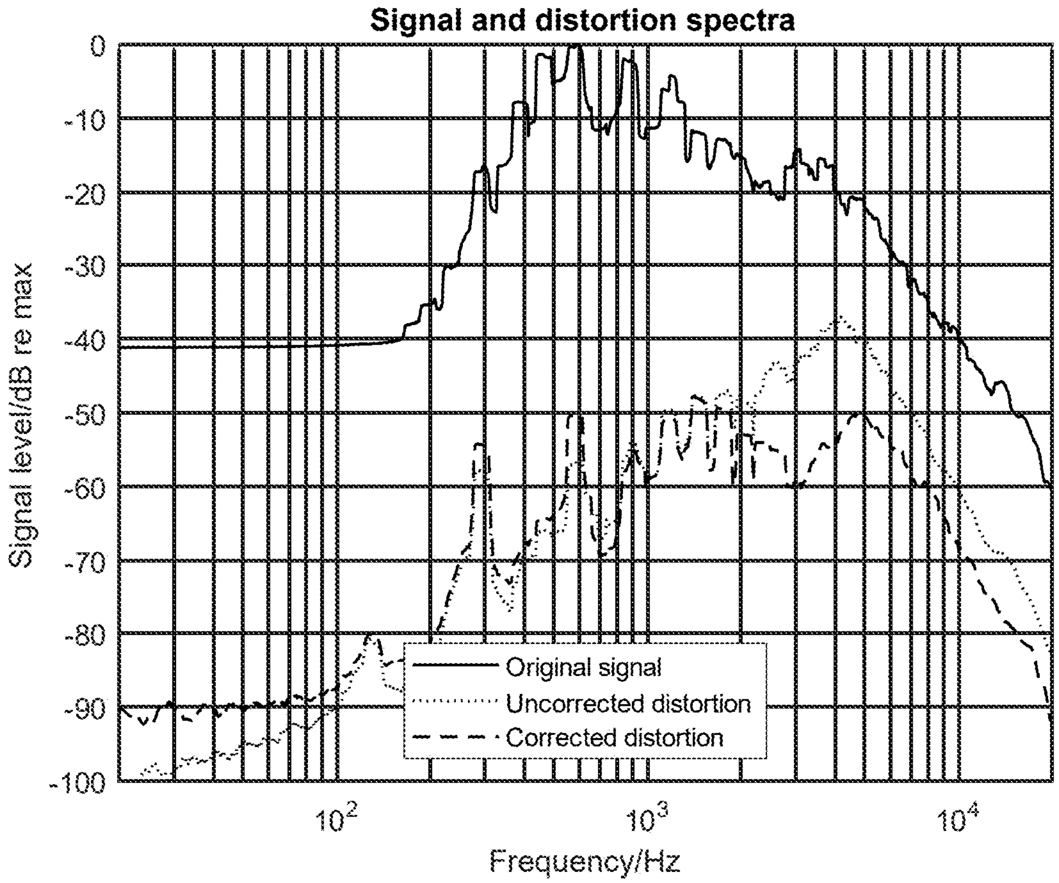
FIG. 12 is a schematic diagram illustrating a signal spectrum and a distortion spectrum according to an embodiment of the present disclosure.

The simulated effect of one embodiment of the present disclosure on an actual music signal is shown in FIG. 12. FIG. 12 is a schematic diagram illustrating a signal spectrum and a distortion spectrum according to an embodiment of the present disclosure. As shown in FIG. 12, the horizontal axis represents the frequency, and the vertical axis represents the signal level. FIG. 12 shows original signal spectrum, uncorrected distortion spectrum, and corrected distortion spectrum. FIG. 12 represents the simulated distortion improvement. The distortion is defined as the difference of the actual spectrum output spectrum and the output spectrum of a linear system that would have the same average frequency response but no distortion. The dotted line ("uncorrected distortion") shows the difference spectrum of a nonlinear loudspeaker simulation model without the correction algorithm, and the dashed line ("corrected distortion") when the correction is applied.

The driver displacement model produces from the input signal module an output signal that corresponds to the expected displacement of the driver in the enclosure where the driver is used. The exact implementation of this model is not critical to the present disclosure. At simplest the model can be a low-pass filter, and further improvements can be made using displacement dependent nonlinear models, and models that take into account e.g. the voice coil temperature variation, derived from either a computational thermal model or from estimating the temperature from driver voltage and current measurement. The model can be also fully adaptive, based on voltage and current information, or in larger loudspeakers, feedback sensor information.

Figure 13:
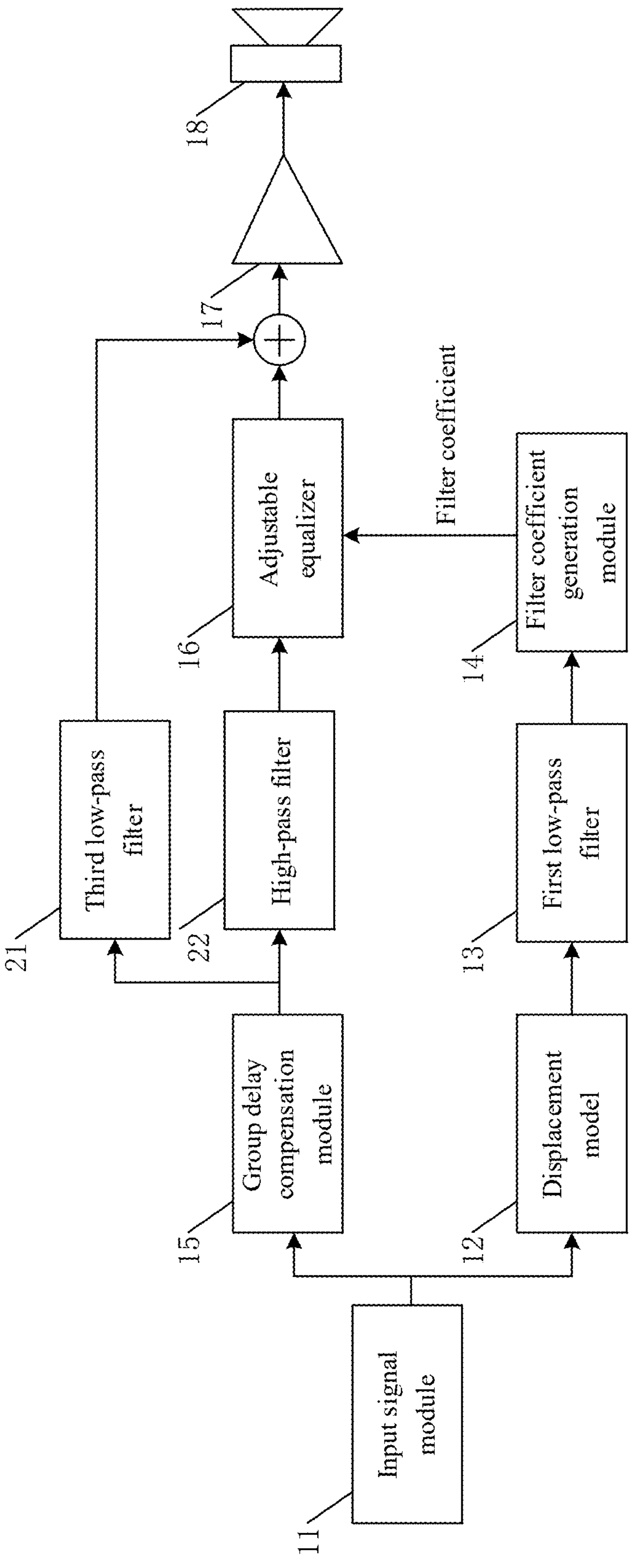
FIG. 13 is a schematic diagram illustrating a structure of a signal processing system according to another embodiment of the present disclosure.

FIG. 13 is a schematic diagram illustrating a structure of a signal processing system according to another embodiment of the present disclosure. As shown in FIG. 13, the system includes: an input signal module 11, a displacement model 12, a first low-pass filter 13, a filter coefficient generation module 14, a group delay compensation module 15, an adjustable equalizer 16, an amplifier 17, an audio converter 18, a third low-pass filter 21, and a high-pass filter 22.

The input signal module 11 is connected to the group delay compensation module 15 and the displacement model 12, respectively. The displacement model 12 is connected to the first low-pass filter 13. The first low-pass filter 13 is connected to the filter coefficient generation module 14. The amplifier 17 is connected to the audio converter 18. The filter coefficient generation module 14 is connected to the adjustable equalizer 16. The group delay compensation module 15 is connected to the third low-pass filter 21. The third low-pass filter 21 is connected to an adder. The group delay compensation module 15 is connected to the high-pass filter 22. The high-pass filter 22 is connected to the adjustable equalizer 16. The adjustable equalizer 16 is connected to the adder. The adder is connected to the amplifier 17.

In the embodiments of the present disclosure, if the frequency separation of the high frequency resonances that are corrected, and the frequency range of the corresponding equalizers is not large, then it is possible that the equalizer designed to correct the high-frequency response has some detrimental effect on the distortion at the low frequency range. In these cases, it is possible either to use a high-pass/low-pass filter pair to bypass the equalization at low frequencies (as shown in FIG. 13) or to apply separate processing for the low frequencies (as shown in FIG. 14).

Figure 14:
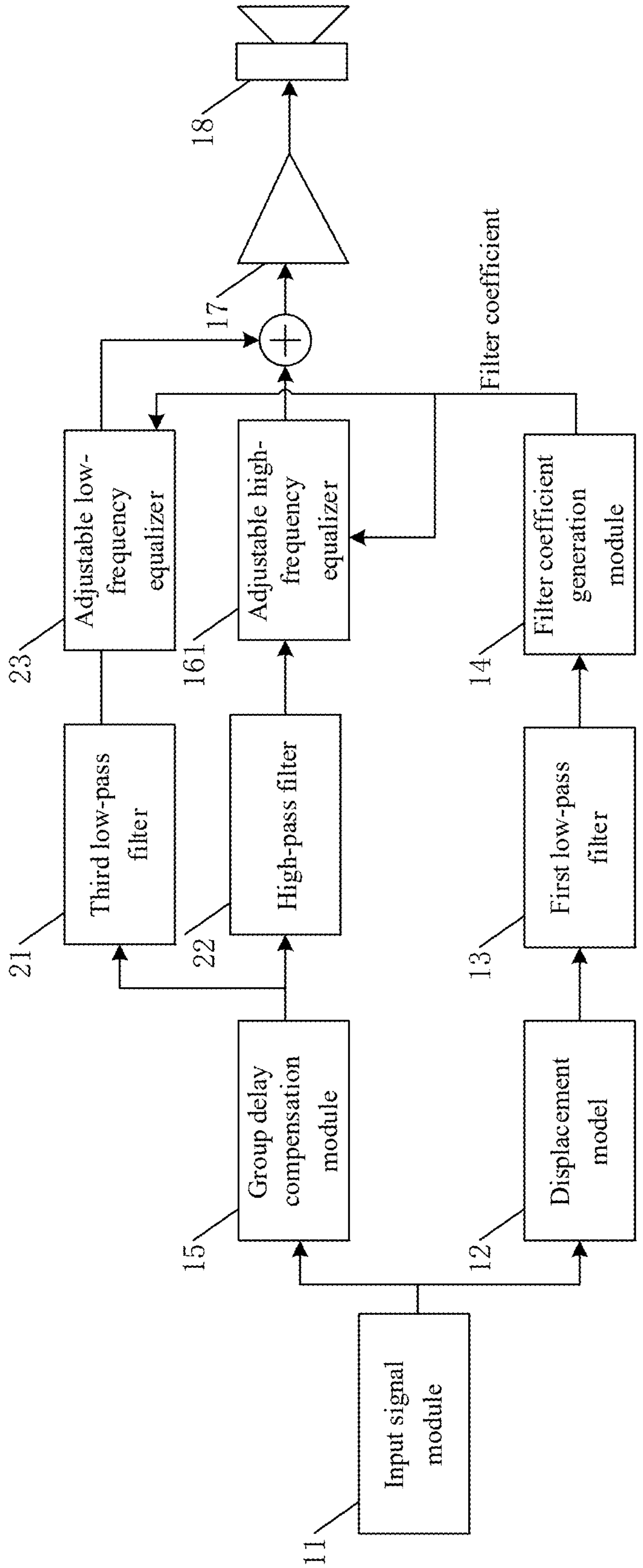
FIG. 14 is a schematic diagram illustrating a structure of a signal processing system according to another embodiment of the present disclosure.

FIG. 14 is a schematic diagram illustrating a structure of a signal processing system according to another embodiment of the present disclosure. As shown in FIG. 14, the system includes: an input signal module 11, a displacement model 12, a first low-pass filter 13, a filter coefficient generation module 14, a group delay compensation module 15, an adjustable high-frequency equalizer 161, an amplifier 17, an audio converter 18, a third low-pass filter 21, a high-pass filter 22 and an adjustable low-frequency equalizer 23.

The input signal module 11 is connected to the group delay compensation module 15 and the displacement model 12, respectively. The displacement model 12 is connected to the first low-pass filter 13. The first low-pass filter 13 is connected to the filter coefficient generation module 14. The amplifier 17 is connected to the audio converter 18. The group delay compensation module 15 is connected to the third low-pass filter 21. The third low-pass filter 21 is connected to the adjustable low-frequency equalizer 23. The adjustable low-frequency equalizer 23 is connected to an adder. The group delay compensation module 15 is connected to the high-pass filter 22. The high-pass filter 22 is connected to the adjustable high-frequency equalizer 161. The adjustable high-frequency equalizer 161 is connected to the adder. The adder is connected to the amplifier 17. The filter coefficient generation module 14 is connected to the adjustable low-frequency equalizer 23 and the adjustable high-frequency equalizer 161, respectively.

In the embodiments of the present disclosure, the c signal processing system can be also constructed fully or partially using analog filters. The analog implementation consists in the control path of displacement model constructed as a low-pass filter (digital or analog), a nonlinearity function that maps the displacement data to filter control parameters (realized, in a fully analog implementation, using e.g. operational amplifiers), and in the drive signal path containing an all-pass filter and a voltage controlled filter. The practical implementation could also contain a mix of analog and digital functions, e.g. an analog VCF controlled by a digital displacement model and a digitally implemented control lookup.

In the embodiments of the present disclosure, the use of the algorithm is not limited to frequency response variation caused by system geometry variation. As an example of other sources of response variation, especially in larger loudspeakers there is mid/high frequency response variation caused by the displacement dependence of voice coil inductance, and this has been generally identified as the major source of mid/high frequency intermodulation distortion in loudspeakers. The inductance effects are measurable as frequency response variation when then driver is subject to static displacement, and can be thus compensated using the same algorithm. Also, the sensitivity of the driver typically changes when the diaphragm is displaced from the static position, mostly due to the variation of the Bl factor, and this effect can be combined into the lookup tables. The variation of driver voice coil temperature in dynamic loudspeakers also caused sensitivity and response shape variation and this can be included as an additional control parameter.

There are algorithms that reduce "piano distortion" by reducing strong low-frequency content when also midrange signal is detected, but the approach used by them unavoidably changes the tonal balance of the signal.

In the embodiments of the present disclosure, the signal processing system may contain a real-time simulation model for the system state parameters, and a variable equalization unit whose parameters are controlled also in real time using the system model. The parameters of the controllable equalizer unit are adjusted to compensate between the frequency response of the system at nominal (small-signal) state and the response determined by the actual displaced position the transducer moving assembly and possibly by other system variables (internal temperature etc.). The equalization unit is on the signal path that is connected to the amplifier and the transducer, and this signal path contains a delay compensation unit that compensates for the group delay of the transducer model.

In the technical solutions provided by the embodiments of the present disclosure, the input signal module, the displacement model, the filter coefficient generation module, the group delay compensation module, the adjustable equalizer, the amplifier and the audio converter are connected are provided. The input signal module is connected to the group delay compensation module and the displacement model, respectively. The displacement model is connected to the filter coefficient generation module. The group delay compensation module is connected to the adjustable equalizer. The adjustable equalizer is connected to the amplifier, which is connected to the audio converter. The filter coefficient generation module is connected to the adjustable equalizer. In the technical solutions provided by the embodiments of the present disclosure, the driver displacement related frequency response variation can be corrected over a wide frequency range and through this reduces distortion, especially intermodulation distortion In the technical solutions provided by the embodiments of the present disclosure, a distortion reduction is achieved while reducing frequency response variation, while alternative methods are based on deliberately changing the tonal balance of the signal. The computational complexity of the model is reasonably low. The signal processing system can be applied to a broad range of electroacoustical systems, not only to microspeakers.

An embodiment of the present disclosure provides an electric device, including the signal processing system described above.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A signal processing system, applied to an electric device and comprising:

an input signal module, a displacement model, a filter coefficient generation module, a group delay compensation module, an adjustable equalizer, an amplifier and an audio converter;

wherein the input signal module is connected to the group delay compensation module and the displacement model, respectively; the displacement model is connected to the filter coefficient generation module; the group delay compensation module is connected to the adjustable equalizer; the adjustable equalizer is connected to the amplifier, the amplifier is connected to the audio converter, and the filter coefficient generation module is connected to the adjustable equalizer.

2. The signal processing system as described in claim 1, further comprising: a low-pass filter, wherein the displacement model is connected to the low-pass filter, and the low-pass filter is connected to the filter coefficient generation module.

3. The signal processing system as described in claim 2, wherein the low-pass filter includes a first low-pass filter, and the signal processing system further includes a port velocity model and a second low-pass filter; and wherein the input signal module is connected to the port velocity model, the port velocity model is connected to the second low-pass filter, and the second low-pass filter is connected to the filter coefficient generation module.

4. The signal processing system as described in claim 2, wherein the low-pass filter includes a first low-pass filter, and the system further includes a third low-pass filter, a high-pass filter and an adder; and wherein the group delay compensation module is connected to the third low-pass filter, the third low-pass filter is connected to the adder, the group delay compensation module is connected to the high-pass filter, the high-pass filter is connected to the adjustable equalizer, and the adjustable equalizer is connected to the adder, and the adder is connected to the amplifier.

5. The signal processing system as described in claim 2, wherein the low-pass filter includes a first low-pass filter, the adjustable equalizer includes an adjustable high-frequency equalizer, and the system further includes: a third low-pass filter, an adjustable low-frequency equalizer, a high-pass filter and an adder; and wherein the group delay compensation module is connected to the third low-pass filter, the third low-pass filter is connected to the adjustable low-frequency equalizer, the adjustable low-frequency equalizer is connected to the adder, the group delay compensation module is connected to the high-pass filter, the high-pass filter is connected to the adjustable high-frequency equalizer, the adjustable high-frequency equalizer is connected to the adder, the adder is connected to the amplifier, and the filter coefficient generation module is respectively connected to the adjustable low-frequency equalizer and the adjustable high-frequency equalizer.

6. The signal processing system as described in claim 2, wherein the group delay compensation module is configured to compensate for group delay of the displacement model and the low-pass filter.

7. The signal processing system as described in claim 1, wherein the filter coefficient generation module is configured to obtain a filter coefficient through an interpolation lookup table, an interpolation function or machine learning.

8. The signal processing system as described in claim 1, wherein the audio converter comprises a speaker, an earphone, or an electroacoustic/electromechanical transducer.

9. The signal processing system as described in claim 1, wherein the displacement model comprises a computationally implemented model for diaphragm displacement of a loudspeaker.

10. An electric device, comprising a signal processing system applied to an electric device and comprising:

an input signal module, a displacement model, a filter coefficient generation module, a group delay compensation module, an adjustable equalizer, an amplifier and an audio converter;

wherein the input signal module is connected to the group delay compensation module and the displacement model, respectively; the displacement model is connected to the filter coefficient generation module; the group delay compensation module is connected to the adjustable equalizer; the adjustable equalizer is connected to the amplifier, the amplifier is connected to the audio converter, and the filter coefficient generation module is connected to the adjustable equalizer.

* * * * *